US012615702B2

(12) United States Patent (10) Patent No.: US 12,615,702 B2
Hörner et al. (45) Date of Patent: Apr. 28, 2026

(54) LUMINOUS FILM, DISPLAY ELEMENT AND METHOD FOR OPERATING A LUMINOUS FILM

(71) Applicant: ams-OSRAM International GmbH, Regensburg (DE)

(72) Inventors: Patrick Hörner, Bamberg (DE); Igor Stanke, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 2 days.

(21) Appl. No.: 18/713,154

(22) PCT Filed: Nov. 22, 2022

(86) PCT No.: PCT/EP2022/082794
§ 371 (c)(1),
(2) Date: May 23, 2024

(87) PCT Pub. No.: WO2023/094374
PCT Pub. Date: Jun. 1, 2023

(65) Prior Publication Data
US 2025/0040014 A1 Jan. 30, 2025

(30) Foreign Application Priority Data

Nov. 24, 2021 (DE) .................... 10 2021 130 804.6

(51) Int. Cl.
*H05B 45/42* (2020.01)
*G09G 3/32* (2016.01)
(Continued)

(52) U.S. Cl.
CPC ............. *H05B 45/42* (2020.01); *H05B 45/20* (2020.01); *G09G 3/32* (2013.01); *H10W 90/00* (2026.01)

(58) Field of Classification Search
CPC ....... H05B 45/42; H05B 45/20; H01L 25/167; G09G 3/035; G09G 3/14; G09G 3/32; G09G 2300/0426; G09G 2300/0452
See application file for complete search history.

(56) References Cited

U.S. PATENT DOCUMENTS

| | | | |
|---|---|---|---|
| 6,414,662 B1 | 7/2002 | Havel | |
| 8,841,856 B1 * | 9/2014 | Beasley | ................. H05B 45/44 |
| | | | 315/253 |

(Continued)

FOREIGN PATENT DOCUMENTS

| | | |
|---|---|---|
| DE | 10 2017 105 559 A1 | 9/2018 |
| DE | 20 2018 104 566 U1 | 10/2018 |

(Continued)

OTHER PUBLICATIONS

Machine Translation WO2020063664A (Year: 2020).*

(Continued)

*Primary Examiner* — Raymond R Chai
(74) *Attorney, Agent, or Firm* — Hauptman Ham, LLP

(57) ABSTRACT
A luminous film includes a carrier on or in which at least one unit cell of light-emitting diodes is arranged. Each unit cell includes a first, a second and a third light-emitting diode. The first and second light-emitting diodes of a unit cell are connected anti-parallel to each other. The third light-emitting diode is connected in series with the parallel connection of the first and second light-emitting diode of the unit cell.

13 Claims, 2 Drawing Sheets

(51) Int. Cl.
| | | |
|---|---|---|
| *H01L 25/16* | (2023.01) |
| *H05B 45/20* | (2020.01) |
| *H10W 90/00* | (2026.01) |

(56)                References Cited

U.S. PATENT DOCUMENTS

| | | | |
|---|---|---|---|
| 2001/0007360 A1* | 7/2001 | Yoshida .............. | H01L 25/0753 |
| | | | 257/89 |
| 2013/0093355 A1* | 4/2013 | Han ....................... | H05B 45/14 |
| | | | 315/294 |
| 2020/0194620 A1 | 6/2020 | Lerman et al. | |

FOREIGN PATENT DOCUMENTS

| | | | | |
|---|---|---|---|---|
| EP | 3 389 094 A1 | 10/2018 | | |
| JP | H5-251749 A | 9/1993 | | |
| JP | 2001-196634 A | 7/2001 | | |
| JP | 2009-519568 A | 5/2009 | | |
| JP | 2011-249411 A | 12/2011 | | |
| JP | 2012-39154 A | 2/2012 | | |
| JP | 2012-113911 A | 6/2012 | | |
| JP | 2012-182486 A | 9/2012 | | |
| JP | 2013-54195 A | 3/2013 | | |
| WO | WO-2020063664 A1 * | 4/2020 | ............. | H05B 44/00 |

OTHER PUBLICATIONS

International Search Report issued for corresponding International Patent Application No. PCT/EP2022/082794 on Feb. 23, 2023, along with an English translation (7 pages).
Written Opinion issued for corresponding International Patent Application No. PCT/EP2022/082794 on Feb. 23, 2023 (11 pages).

\* cited by examiner

LUMINOUS FILM, DISPLAY ELEMENT AND METHOD FOR OPERATING A LUMINOUS FILM

CROSS REFERENCE TO RELATED APPLICATION

This application is a National Stage of International Application No. PCT/EP2022/082794, filed on Nov. 22, 2022, which designates the United States and was published in Europe, and which claims priority to German Patent Application No. 10 2021 130 804.6, filed on Nov. 24, 2021, in the German Patent Office. Both of the aforementioned applications are hereby incorporated by reference in their entireties.

The following description concerns a luminous film, a display element and a method for operating a luminous film.

INTRODUCTION

Luminous films, also known as "LED on film" or "light in glass", have a plurality of applications in industrial and consumer sectors, such as automotive, signage, transportation or building services etc. These applications include displays and design elements in particular. In the technical implementation, different colored light-emitting diodes are often interconnected in a metallization layer and dynamically controlled. The light-emitting diodes, also known as pixels, often form unit cells with different emitted colors. One example is the RGB pixel with pixels that can emit in red, green and blue.

In order to achieve the greatest possible design freedom and dynamics for the respective application, it should often be possible to selectively control all or at least some of the light-emitting diodes. This usually requires a complex arrangement of control lines. If the luminous film has a metallization layer, for example, common electrodes and three control lines are used for one RGB pixel. In addition, a daisy chain circuit and corresponding driver circuits are used. Until now, the solutions usually required crossing conductor paths or the use of integrated circuits, ICs. Alternatively, it can also be wired individually, which means a high number of lines. For solutions with two or more metallization planes, matrix interconnection is often used, possibly with multiplexing. Both solutions have the disadvantage of requiring a large number of control lines and complex wiring.

It is the objective of the present disclosure to propose a luminous film, a display element and a method for operating a luminous film which allow fewer control lines and less complex wiring.

These objectives are achieved by the subject matter of the independent claims. Further developments and embodiments are described in the dependent claims and are apparent from the following description and the drawings.

SUMMARY

It is understood from the following that any feature described in relation to any embodiment may be used alone or in combination with other features described below, and may also be used in combination with one or more features of any other embodiment or any combination of another embodiment, unless described as an alternative. In addition, equivalents and modifications not described below may also be used without departing from the scope of the proposed luminous film, the display element and the method of operating a luminous film defined in the accompanying claims.

An improved concept in the field of light-emitting films is presented below. One aspect concerns a partially anti-parallel connection of light-emitting diodes. Suitable control of these partially anti-parallel connected light-emitting diodes allows color mixing, for example for generation of RGB pixels on film or glass with only one metallization plane. The advantageous interconnection makes it possible to save on signal lines and thus increase the transparency of the illuminated film.

According to at least one embodiment, a luminous film comprises a carrier on or in which at least one unit cell of light-emitting diodes is arranged. A unit cell comprises a first, a second and a third light-emitting diode. The first and second light-emitting diodes of a unit cell are connected anti-parallel to each other. The third light-emitting diode is connected in series with the parallel connection of the first and second light-emitting diode of the unit cell.

During operation of the luminous film, the light-emitting diodes of the unit cell can be controlled differently. For example, signals can be applied to the light-emitting diodes in such a way that only one of the light-emitting diodes is active, i.e. light emitting, while the other light-emitting diodes of the unit cell are not active, i.e. are not light emitting. Furthermore, signals can be applied to the light-emitting diodes in such a way that two light-emitting diodes are light emitting at the same time. In this way, suitable control results in a variety of lighting states that can be used to display different color patterns, for example. In particular, the anti-parallel wiring can save control lines and require less complex wiring.

In the context of this disclosure, a light-emitting diode, or LED, is a semiconductor component that emits light when an electric current flows in a forward direction. In addition to regular LEDs, other types such as OLEDs, micro-LEDs, etc. can also be used. The LED blocks in the reverse direction. Light-emitting diodes generate monochromatic light and can be combined for additive color mixing, for example to generate white light. Such a combination can be achieved with the described unit cells. The monochromatic light generated is described below by the term emitted color. In this sense, red, green, blue light-emitting diodes, so-called RGB LEDs, describe specifically those light-emitting diodes that have a red, green or blue emitted color.

The luminous film comprises the carrier. The unit cells or light-emitting diodes are structured into the carrier. The carrier comprises, for example, a transparent film, a plastic film, a metal film or the like. The unit cells proposed herein can be arranged as a plurality of cells on or in the carrier in the area of the carrier in the manner of a matrix. In this way, luminous films can be assembled from small to large areas, enabling a variety of applications.

According to at least one further embodiment, a unit cell has a first control line, a second control line and a third control line. The first control line is electrically conductively connected to a common electrode of the anti-parallel connected first and second light-emitting diode. The second control line is electrically conductively connected to a common electrode of the first, second and third light-emitting diode. The third control line is electrically conductively connected to an electrode of the third light-emitting diode.

In other words, the first control line is connected to the common electrode of the antiparallel LEDs. The second control line is connected to the common electrode of all three LEDs. Finally, the third control line is connected to the electrode of the third, individual LED.

During operation, the individual control lines are used to supply the light-emitting diode with the applied signals. The signals include, for example, a zero potential, GND, a positive potential, +, or a negative potential, −. The signals can be applied statically or dynamically to the individual control lines. The term "static" means that the applied signal is present for a defined period of time, while "dynamic" means that the applied signals change in a defined period of time on the control lines.

An example of control with zero potential, positive potential and negative potential is shown in the following table. L1, L2 and L3 denote the first, second and third light-emitting diode. S1, S2 and S3 are the first, second and third control lines to which a combination of the signals is applied in states A to E respectively.

|   | S1 | S2 | S3 | L1 | L2 | L3 |
|---|---|---|---|---|---|---|
| A | + | GND | GND | on | off | off |
| B | GND | GND | + | off | on | off |
| C | − | GND | GND | off | off | on |
| D | + | GND | + | on | on | off |
| E | − | GND | + | off | on | on |

Individual light-emitting diodes can be controlled with the states A, B and C so that only one light-emitting diode L1, L2 or L3 is active at a time and emits in the respective emitted color. For example, it is possible to generate primary colors using suitable static signals on the control lines. Furthermore, the light-emitting diodes with the states D and E can be controlled in such a way that only two light-emitting diodes are active and emit in the respective emitted color. For example, a mixture of two primary colors is possible using suitable static signals on the control lines.

Finally, the states A to E can be dynamically cycled through in a defined time ratio. This means that the three light-emitting diodes are active at defined times or durations so that they emit in the respective emitted color. This makes it possible to mix three primary colors (e.g. for a white impression). For example, the states A, B and C or the states D and E can be cycled through in the desired temporal ratio using suitable dynamic signals on the control lines. The signals on the control lines are varied over time within a "frame" for color mixing.

According to at least one further embodiment, the control lines form a common metallization plane, in particular exactly one common metallization plane.

The metallization plane provides electrically conducting connections with a two-dimensional course in the carrier. The connections or control lines are used to connect the unit cells and light-emitting diodes, i.e. for current or voltage supply and signal transmission.

According to the proposed concept, a common metallization plane can be used to control the unit cells and light-emitting diodes. This leads to a reduction in costs and complexity, as control lines in particular can be saved due to the anti-parallel wiring.

According to at least one further embodiment, the unit cells comprise one or more further light-emitting diodes.

According to at least one further embodiment, the light-emitting diodes of a unit cell each have different emitted colors. Alternatively, or additionally, light-emitting diodes of a unit cell each have the same emitted color. Furthermore, two of the light-emitting diodes of a unit cell can each have the same emitted color.

In particular, the luminous film can only comprise unit cells of the same type, which have the same emitted colors. The luminous film can comprise different unit cells that have different emitted colors.

The emitted colors of the light-emitting diodes can be used to determine the emitted color of the luminous film. On the one hand, the emitted color and its progression over time can be determined during operation by the signals applied to the light-emitting diodes. The individual emitted colors of the light-emitting diodes determine which emitted colors of the unit cells and the luminous film can be set by the control.

If, for example, all light-emitting diodes are configured to emit with the same emitted color, the emitted color of the associated unit cell is monochrome. If two of the light-emitting diodes of a unit cell have the same emitted color, the associated unit cell can emit in two colors or with a mixture of two colors. This has the additional advantage that, for example, one of the two light-emitting diodes with the same emitted color can be kept in reserve in case the other light-emitting diode is defective. Three different emitted colors per unit cell allow the setting of different primary and mixed colors.

According to at least one further embodiment, the light-emitting diodes of a unit cell have the emitted colors red, green and blue. In this way, the unit cell forms a RGB cell. In addition to the primary colors red, green and blue, white can be set as a mixed color with appropriate dynamic control of the individual light-emitting diodes.

According to at least one further embodiment, the carrier is flexible. In this way, the luminous film can be flexibly shaped and thus attached to different objects.

According to at least one further embodiment, the luminous film comprises a plurality of unit cells of light-emitting diodes. The unit cells are arranged in a row on or in the carrier.

The unit cells in the row can, for example, be electrically connected by means of the second control line and thus controlled via a common control line. The first and third control lines can then be controlled individually for each unit cell. This allows the unit cell to be controlled individually and to display primary and/or mixed colors as described. A small display, for example, can be realized by stringing them together. The number of control lines and the corresponding complexity can be further reduced.

According to at least one further embodiment, the unit cells are arranged rotationally-symmetrically in the unit cells following one another in the row. Adjacent unit cells can thus be arranged in a space-saving manner.

According to at least one further embodiment, the light-emitting diodes of the unit cells are arranged in an L-shape. Successive L-shaped unit cells in the row are each arranged rotated relative to one another.

Due to the continuous arrangement of L-shaped unit cells in the row, the unit cells can interlock to save space. In this way, a regular arrangement of unit cells can be realized on the luminous film. In the example of RGB cells, sub-rows can be realized in which, for example, the RGB light-emitting diodes follow each other regularly.

According to at least one further embodiment, the unit cells are arranged in a planar manner on or in the carrier.

According to at least one further embodiment, the unit cells are arranged in segments on or in the carrier and are electrically interconnected. In operation, the segments are each controlled individually by common control lines. For example, neighboring segments share a common control line in pairs. Neighboring segments share one of the control lines.

According to at least one embodiment, a display element comprises a luminous film according to one or more aspects proposed in this disclosure. Further, a driver circuit is provided to drive the unit cells and/or the light-emitting diodes by means of control lines.

Furthermore, a method for operating a luminous film is disclosed. All features of the luminous film are also disclosed for the method for operating a luminous film and vice versa.

According to at least one embodiment, signals are applied to the light-emitting diodes of the unit cell. In at least a first state, signals are applied to the light-emitting diodes in such a way that only one of the light-emitting diodes is active, i.e. light emitting, while the other light-emitting diodes of the unit cell are not active, i.e. are not light emitting. In at least a second state, signals are applied to the light-emitting diodes in such a way that two light-emitting diodes emit light at the same time.

According to at least one embodiment, the first and/or second states are controlled statically or dynamically.

Further advantages and advantageous embodiments as well as further embodiments of the description presented result from the embodiments described below in conjunction with figures.

In the embodiments and figures, components that are identical or have the same effect may each be provided with the same reference signs. The elements shown and their proportions to one another are not to be regarded as true to scale; rather, individual elements, such as layers, components, structural elements and areas, may be shown in exaggerated thickness or large dimensions for better visualization and/or better understanding.

DETAILED DESCRIPTION

Figure 1:
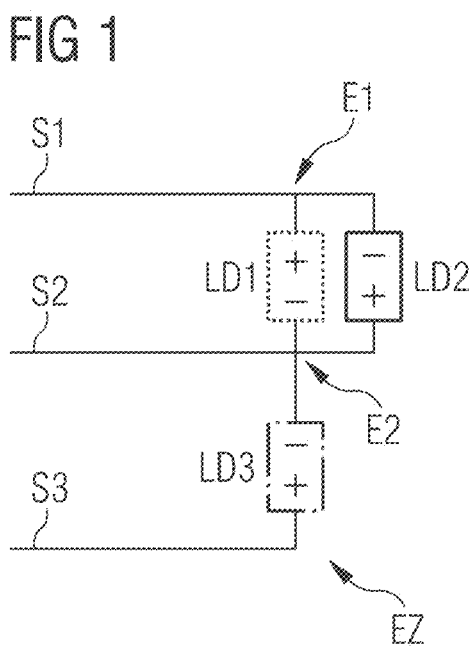
FIGS. 1 to 4 show exemplary embodiments of luminous films.

FIG. 1 shows an exemplary embodiment of a unit cell for a luminous film. The figure shows a unit cell EZ with a partially antiparallel connection of light-emitting diodes LD1, LD2, LD3. The light-emitting diodes are designed as RGB LEDs with red, green and blue emitted color generation of an RGB cell. The first light-emitting diode LD1 is a red light-emitting diode, the second light-emitting diode LD2 is a blue light-emitting diode and the third light-emitting diode LD3 is a green light-emitting diode.

The light-emitting diodes are controlled with three control lines S1, S2 and S3. The red light-emitting diode LD1 and the blue light-emitting diode LD2 are connected antiparallel to each other. The first control line S1 is connected to a common electrode E1, the red light-emitting diode LD1 and the blue light-emitting diode LD2, which are connected in antiparallel with each other. The second control line S2 is connected to a common electrode E2 of all three light-emitting diodes LD1, LD2, LD3. The green light-emitting diode LD3 is connected on the one hand to the common electrode 2 and on the other hand to the third control line S3. For this light-emitting diode, for example, the green emitted color is selected because it is most needed for a mixed color "white". Therefore, the green light-emitting diode LD3 is to a certain extent individual, i.e. not part of the antiparallel connection and can therefore be controlled more directly. Theoretically, each of the three primary colors can be connected individually.

During operation, different signals or signal sequences are applied to the three control lines S1, S2 and S3. For example, the signals are a zero potential (GND), a positive potential (+) or a negative potential (−). Combinations of the currently applied signals define operating states A to E. During operation, these operating states can be set statically for a specific time. For example, primary colors can be displayed. The operating states can also be controlled dynamically so that individual light-emitting diodes emit light with a certain time ratio, giving the impression of mixed colors, for example.

In this example of an RGB unit cell, the operating states can be set according to the following table.

|   | S1 | S2 | S3 | LD1 | LD2 | LD3 |
|---|-----|-----|-----|---------|----------|-----------|
| A | + | GND | GND | on, red | off | off |
| B | GND | GND | + | off | on, blue | off |
| C | − | GND | GND | off | off | on, green |
| D | + | GND | + | on, red | off | on, green |
| E | − | GND | + | off | on, blue | on, green |

In operating states A, B, C, the primary colors red, green and blue are displayed individually by the corresponding light-emitting diodes LD1, LD2 and LD3. In operating states D and E, red and green (D with LD1 and LD3) and green and blue (E with LD2 and LD3) are displayed together as emitted colors.

In summary, the following functions can be implemented using the proposed wiring and control:

Generation of primary colors using suitable static signals on the control lines, Mixing of two primary colors using suitable static signals on the control lines, Mixing of three primary colors (e.g. white) using suitable dynamic signals on the control lines, i.e. temporal variation of the signals on the control lines within a "frame" for color mixing (see table)

Example white:

Operating states: A, B, C in a temporal relationship

Operating states: D, E in a temporal relationship.

The proposed unit cell enables the use of one metal plane in a luminous film. Compared to other solutions, costs and complexity can be reduced. One aspect of this is the saving of control lines due to the anti-parallel connection of the light-emitting diodes in a unit cell. Finally, the transparency of the luminous film (e.g. LED on film) can be increased by saving on control lines.

Figure 2:
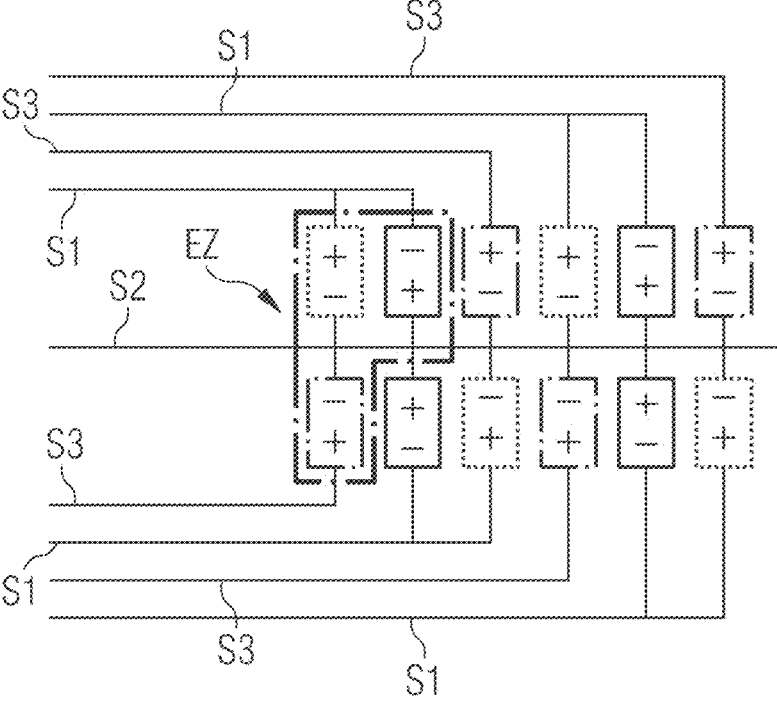

FIG. 2 shows an exemplary embodiment of a luminescent film. In particular, the figure shows an arrangement of several unit cells according to the type shown in connection with FIG. 1. The individual unit cells are L-shaped and arranged in a row. Neighboring unit cells are rotated in relation to each other so that the L shapes interlock with gaps. This results in a rotationally symmetric arrangement of neighboring unit cells.

The unit cells are electrically connected to each other by means of their second control lines S2 or share a control line S2. This connection is made by a common control line, which takes the place of the respective second control lines during operation in accordance with the operating states shown above. In other words, in the table shown above, the second control line can be replaced by the common control line and the corresponding signals can be applied.

Furthermore, the individual unit cells can each be controlled individually via their own first and third control lines S1, S3, for example as shown in the table.

With the arrangement presented, the number of contacts per row can be reduced to 2*n+1, where n is the number of RGB light-emitting diodes per row. This results in a total of 2*n+1)*m contacts, where m is the number of rows. One possible application is, for example, a small display (e.g. with segments).

Figure 3:
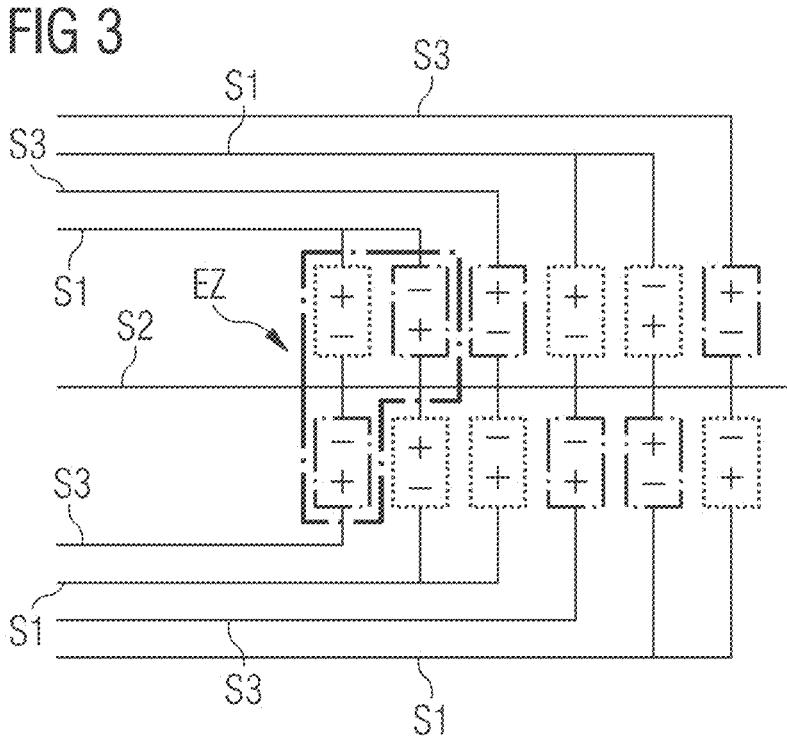

FIG. 3 shows a further exemplary embodiment of a luminous film. The wiring corresponds to the example in FIG. 2, although three light-emitting diodes LD1 to LD3 are provided in a unit cell, which may have two different emitted colors. Two light-emitting diodes have the same emitted color. Due to the L-shaped and rotationally symmetric arrangement, LEDs of the same color are placed spatially close to each other between successive unit cells. Adjacent LEDs of the same color can thus be used as a backup (same neighbor).

Figure 4:
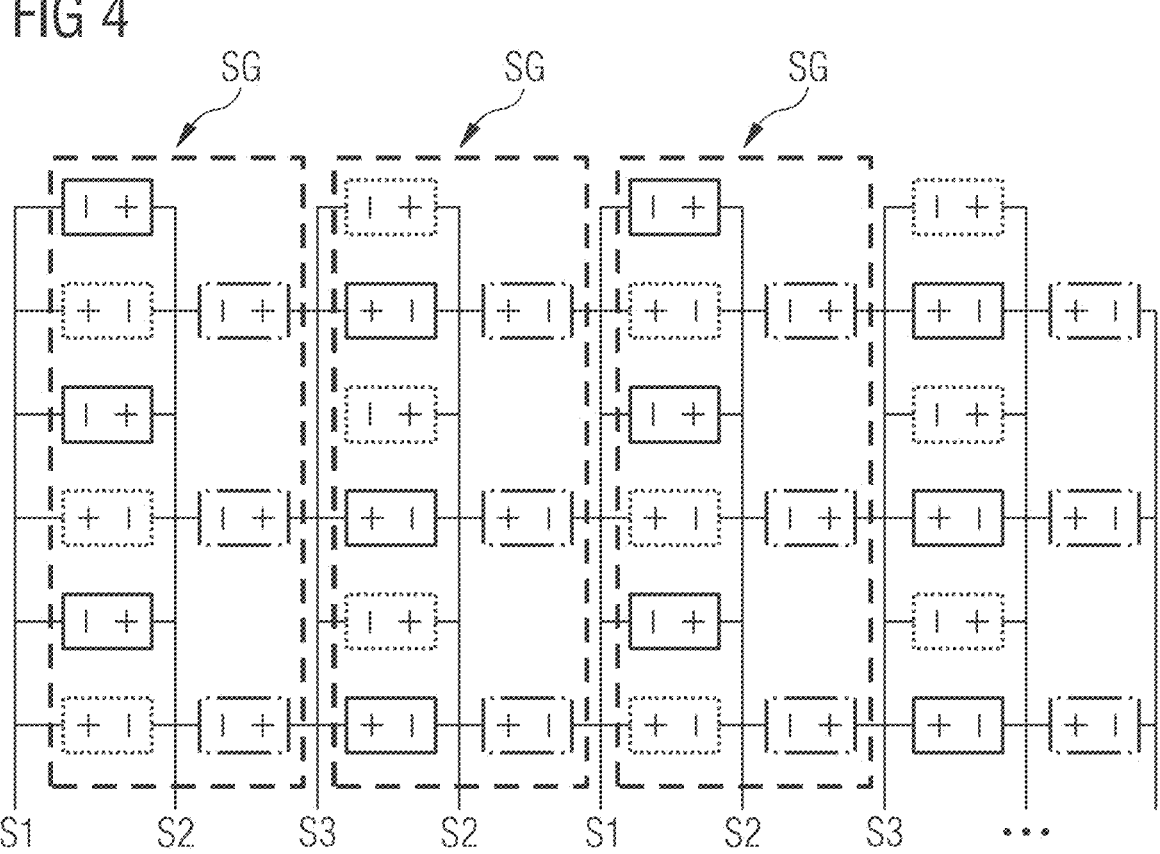

FIG. 4 shows another exemplary embodiment of a luminous film. In this example, several unit cells (in this example, three in each case) are combined to form a segment SG. The unit cells of a segment are connected in the manner of the series connection shown in FIGS. 2 and 3 by means of a common second control line. The respective unit cells can be L-shaped and interconnected as explained in connection with FIG. 1. Furthermore, the respective first and third control lines S1, S3 are interconnected. Therefore, the unit cells of a segment are switched together (not independently). This ultimately results in three control lines for a segment, which are controlled with signals in analogy to the table above.

Adjacent segments share a control line S2, but cannot be switched simultaneously. The control line shared by the segments varies. In FIG. 4, S3 is the common line between SG1 and SG2. Between SG2 and SG3, on the other hand, it is S1. To operate all segments, multiplexing 1:2 (every second segment) can be implemented with a suitable driver circuit. The shape of the segments can be designed as desired. The number of contacts is 2*n+1, where n is the number of segments. Possible applications include pictograms or area display devices.

The foregoing description explains many features in specific detail. These are not intended to be construed as limitations on the scope of the improved concept or what can be claimed, but rather as exemplary descriptions of features that are specific only to certain embodiments of the improved concept. Certain features described in this description in connection with individual embodiments may also be realized in combination in a single embodiment. Conversely, various features described in connection with a single embodiment may also be implemented in multiple embodiments separately or in any suitable sub-combination. Moreover, although features are described above as acting together in certain combinations and even originally claimed as such, one or more features from a claimed combination may in some cases be excluded from the combination, and the claimed combination may be directed to a sub-combination or variation of a sub-combination.

Although the drawings show operations in a particular order, this is not to be taken to mean that these operations must be carried out in the order shown or in sequential order, or that all the operations shown must be carried out to achieve the desired results. In certain circumstances, different sequences or parallel processing may be advantageous.

A plurality of implementations has been described. Nevertheless, various modifications can be made without departing from the spirit and scope of the improved concept. Accordingly, other implementations also fall within the scope of the claims.

LIST OF REFERENCE SYMBOLS

E1 electrode
E2 electrode
EZ unit cell
LD1 light-emitting diode
LD2 light-emitting diode
LD3 light-emitting diode
S1 control line
S2 control line
S3 control line
SG segment

The invention claimed is:

1. A luminous film comprising a carrier on or in which several unit cells of light-emitting diodes are arranged, wherein:
   each unit cell comprises a first, a second and a third light-emitting diode,
   the first and second light-emitting diodes of a unit cell are connected anti-parallel to each other, and
   the third light-emitting diode is connected in series with the parallel connection of the first and second light-emitting diode of the unit cell,
   and wherein each unit cell further comprises:
   a first control line, which is electrically conductively connected to a common electrode of the anti-parallel connected first and second light-emitting diode,
   a second control line, which is electrically conductively connected to a common electrode of the first, second and third light-emitting diode, and
   a third control line, which is electrically conductively connected to an electrode of the third light-emitting diode,
   wherein
   the unit cells are arranged in a row on or in the carrier and are electrically interconnected by their second control lines,
   or wherein
   the unit cells are arranged in segments in a planar manner on or in the carrier and electrically interconnected, wherein unit cells of a segment are connected in series connection with a common first control line, a common second control line, and a common third control line,
   the segments are each controlled individually by respective common second control lines, and
   neighboring segments share one of the common first and common third control lines, such that the total number of control lines is 2*n+1, wherein n is the number of segments.

2. The luminous film according to claim 1, wherein the control lines form a common metallization plane, in particular form exactly one common metallization plane.

3. The luminous film according to claim 1, wherein the unit cells comprise one or more further light-emitting diodes.

4. The luminous film according to claim 1, wherein
   the light-emitting diodes of a unit cell each have different emitted colors,
   the light-emitting diodes of a unit cell each have the same emitted color, or
   two of the light-emitting diodes in a unit cell have the same emitted color.

5. The luminous film according to claim 1, wherein the light-emitting diodes of a unit cell have the emitted colors red, green and blue.

6. The luminous film according to claim 1, wherein the carrier is flexible.

7. The luminous film according to claim 1, wherein the unit cells are arranged rotationally symmetrically in the row on or in the carrier.

8. The luminous film according to claim 1, wherein the light-emitting diodes of the unit cells are arranged in an L-shape, and successive L-shaped unit cells in the row are arranged rotated in relation to each other.

9. A display element, comprising:

a luminous film according to claim 1, and a driver circuit for controlling the unit cells and/or the light-emitting diodes by control lines.

10. A method of operating a luminous film, the luminous film comprising a carrier on or in which several unit cells of light-emitting diodes are arranged, wherein:

each unit cell comprises a first, a second and a third light-emitting diode, the first and second light-emitting diodes of a unit cell are connected anti-parallel to each other, and the third light-emitting diode is connected in series with the parallel connection of the first and second light-emitting diodes of the unit cell;

and wherein each unit cell comprises:

a first control line, which is electrically conductively connected to a common electrode of the anti-parallel connected first and second light-emitting diode, a second control line, which is electrically conductively connected to a common electrode of the first, second and third light-emitting diode, and a third control line, which is electrically conductively connected to an electrode of the third light-emitting diode;

and the method comprises applying signals to the light-emitting diodes of the unit cell such that:

in at least a first state, signals are applied to the light-emitting diodes in such a way that only one of the light-emitting diodes is active, i.e. light emitting, while the other light-emitting diodes of the unit cell are not active, i.e. are not light emitting, and in at least in at least a second state, signals are applied to the light-emitting diodes in such a way that two light-emitting diodes emit light at the same time;

wherein the unit cells are arranged in a row on or in the carrier and are electrically interconnected by their second control lines, or wherein the unit cells are arranged in segments in a planar manner on or in the carrier and electrically interconnected, wherein unit cells of a segment are connected in series connection with a common first control line, a common second control line, and a common third control line, the segments are each controlled individually by respective common second control lines, and neighboring segments share one of the common first and common third control lines, such that the total number of control lines is 2*n+1, wherein n is the number of segments.

11. The method according to claim 10, wherein the first and/or second states are controlled statically or dynamically.

12. The method according to claim 10, wherein, when arranged in a row, individual unit cells are each controlled individually via their first and third control lines.

13. The method according to claim 10, wherein when arranged in segments, the unit cells of a segment are switched together an neighboring segment are not switched simultaneously.

* * * * *